United States Patent [19]

Brower et al.

[11] 4,320,440
[45] Mar. 16, 1982

[54] CONNECT SWITCH

[75] Inventors: Boyd G. Brower; John W. Shaffer, both of Williamsport, Pa.

[73] Assignee: GTE Products Corporation, Stamford, Conn.

[21] Appl. No.: 21,398

[22] Filed: Mar. 19, 1979

[51] Int. Cl.³ .................. H05B 41/04; H05B 43/02; F21V 23/04; F21K 5/02
[52] U.S. Cl. .................................... 362/13; 200/265; 200/267; 200/61.02; 362/251; 431/359
[58] Field of Search .......................... 362/13, 15, 251; 431/359; 200/265, 267, 61.02, 12, DIG. 36

[56] References Cited

U.S. PATENT DOCUMENTS

| | | | |
|---|---|---|---|
| 3,990,832 | 11/1976 | Smialek et al. | 431/359 |
| 3,990,833 | 11/1976 | Holub et al. | 362/15 |
| 4,041,300 | 8/1977 | Blount | 362/13 |
| 4,080,155 | 3/1978 | Sterling | 362/13 |
| 4,144,418 | 3/1979 | Girard | 362/13 |
| 4,182,607 | 1/1980 | Collins et al. | 362/15 |

Primary Examiner—Benjamin R. Padgett
Assistant Examiner—Irwin Gluck
Attorney, Agent, or Firm—Edward J. Coleman

[57] ABSTRACT

A photoflash unit having a plurality of high voltage type flashlamps mounted in a planar array on a printed circuit board containing circuitry for sequentially igniting the flashlamps in response to successive high voltage firing pulses applied thereto. The circuitry includes a plurality of solid state switches capable of being easily activated by radiant energy generated during flashing of lamps located adjacent to respective switches. Initially, the switches have a high resistance, and after being activated by radiation, they undergo chemical conversion to a conductive state. The switches are prepared from compositions which include a comparatively large proportion of nonconductive inert particulate solids to improve switch functioning.

9 Claims, 4 Drawing Figures

CONNECT SWITCH

BACKGROUND OF THE INVENTION

This invention relates to multilamp photoflash devices having circuit means for sequentially igniting the flashlamps and, more particularly, to improved means for permitting reliable flashing of an array of photoflash lamps.

Numerous multilamp photoflash arrangements with various types of sequencing circuits have been described in the prior art, particularly in the past few years. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of an adjacently located flashlamp. The present invention is concerned with an improved radiant-energy-activated switching means useful in a relatively inexpensive photoflash unit of the disposable type. In particular, the present switching means is particularly advantageous in photoflash arrays employing high voltage type lamps adapted to be ignited sequentially by successively applied high voltage firing pulses from a source such as a camera-shutter-actuated piezoelectric element.

A currently marketed photoflash unit of the last-mentioned type is described in U.S. Pat. Nos. 3,894,226 and 4,017,728 and referred to as a flipflash. The unit comprises a planar array of high voltage flashlamps mounted on a printed circuit board with an array of respectively associated reflectors disposed therebetween. The circuit board comprises an insulating sheet of plastic having a pattern of conductive circuit traces, including terminal contacts, on one side. The flashlamp leads are electrically connected to the circuit traces, such as by means of eyelets, and the circuitry on the board includes a plurality of solid state switches that chemically change from a high to low resistance, so as to become electrically conducting after exposure to the radiant heat energy from an ignited flashlamp operatively associated therewith. The purpose of the switches is to promote lamp sequencing and one-at-a-time flashing. One type of solid state switch which operates in this manner is described in U.S. Pat. No. 3,458,270 of Ganser et al, in which the use of silver oxide in a polyvinyl binder is taught as a normally open radiant energy switch. Upon radiant heating, the silver oxide decomposes to give a metallic silver residue which is electrically conductive. More recently, silver carbonate has been favored over silver oxide for this use because of its lower conductivity toward high voltage prior to thermal actuation. For example, U.S. Pat. No. 3,990,833, Holub et al, describes a mass of a composition comprising silver oxide, a carbon-containing silver salt and a humidity resistant organic polymer binder, the switch mass being deposited on a circuit board so as to interconnect a pair of spaced apart electrical terminals formed by the printed circuitry thereof. A similar type radiation switch exhibiting an even greater humidity resistance at above normal ambient temperatures is described and claimed in U.S. Pat. No. 3,990,832, Smialek et al, which describes the use of a particular stabilizer additive, such as an organic acid, to preclude or reduce the tendancy of the silver source in the switch material from premature conversion to a low electrical resistance when exposed to ambient humidity conditions. U.S. Pat. No. 3,951,582, Holub et al, describes a similar type switch with a colored coating, and U.S. Pat. No. 4,087,233, Shaffer, describes a switch composition comprising silver carbonate, a binder, and an oxidizer such as barium chromate, which is particularly resistant to high relative humidity and above normal ambient temperatures. U.S. Pat. No. 3,969,065, Smialek, describes a solid state switch comprising a mixture of solid copper salt with a humidity resistant organic polymer binder and a finely divided metal reducing agent, and a U.S. Pat. No. 3,969,066, Smialek et al, describes a switch comprising a mixture of finely divided cupric oxide with a humidity resistant organic polymer binder.

In each of the above cases, the switching device comprises a mass of the switch material being interconnected to a pair of spaced apart electrical terminals in the electrical circuit, typically comprising a pattern of conductive traces disposed on a dielectric board. A problem has been observed during the functioning of such switch materials, however, in that conversion of the solid state mass from a high to low electrical resistance condition can be sufficiently vigorous that the switch material can be burned off or blown off of the circuit board and thereby fails to provide a low resistance path to the next unflashed lamp. It has been found that this problem can be avoided or reduced considerably by incorporating an electrically nonconductive inert particulate solid, such as glass beads, into the switch composition. For example, a silver carbonate switch composition employing approximately 10% by weight of glass beads to act as a heat sink has been found to provide satisfactory performance in the 8-lamp type of flipflash arrays. The use of a glass bead filler in a solid state switch is also described in U.S. Pat. No. 4,080,155 of Sterling.

More recently, an improved multilamp photoflash unit has been developed which more efficiently utilizes a given housing volume and thereby reduces the cost of the unit per flashlamp contained therein. Such a unit is described in copending patent applications Ser. No. 840,497 (Audesse et al) and Ser. No. 840,498 (Armstrong), both filed Oct. 7, 1977, and assigned to the present assignee. In the particular embodiment described therein, ten lamps are provided in the housing having the same dimensions as the above-discussed 8-lamp flipflash. Such a compact construction results in the lamps being located in closer proximity to the above-mentioned solid state radiation switches. In such an application, it has been found that silver carbonate switch compositions including up to 10% by weight of glass beads do not provide sufficient protection to prevent switch burn off. Further, the filler of glass beads does not significantly lighten the color of the dried switch paste so as to thereby reduce the heat absorbed by the switches. In fact, it had been observed that enough heat was absorbed to melt holes in an overlying transparent polyester insulator sheet separating the circuit board from metalized reflectors in the unit. As the reflectors of this unit are grounded to provide an electrostatic shield, holes melted through the insulator sheet would allow arcing to occur between the switches and the grounded reflector.

SUMMARY OF THE INVENTION

Accordingly, it is an object of the present invention to provide a photoflash unit having improved switching means for permitting reliable flashing of an array of photoflash lamps.

A principal object of the invention is to provide an improved, normally open radiation-actuated electrical switch for use in devices such as photoflash arrays and in which the switch composition is desensitized in a manner which avoids "burn off" and/or "melt-through" of overlying insulating sheets in compact photoflash packages while retaining reliable functioning.

These and other objects, advantages and features are obtained, in accordance with the invention, by replacing part of the silver carbonate and/or silver oxide in the switch composition with a proportion of electrically nonconductive inert particulate solids which comprise as much as 25-65% by weight of the total dried composition. Such high percentages of replacement of the silver compound could not be achieved with commercially available lime glass beads alone since their composition includes about 13.7% sodium oxide. Some of the sodium oxide leaches out of the glass beads under humid conditions and provides ionic contaminents. A sufficiently high percentage of ionic contaminents allows electrical leakage across the normally open switch resulting in undesirable multiple flashes. Accordingly, we have determined that the proportion of sodium-containing material, such as glass beads, in the admixture of nonconductive particulate solids should not be more than 10% by weight of the total dried composition. In accordance with the present invention, therefore, the high proportion of nonconductive inert particulate solids is provided by using a filler such as titanium dioxide either alone or in combination with a proportion of glass beads restricted as above. Other inert fillers that can be used are aluminum oxide, aluminum phosphate, barium sulfate, and silicon dioxide. This inert filler acts as a heat absorbing sink and reduces the percentage of the switch which chemically changes when the radiant energy of the lamp heats it up. Further, the inert fillers according to the present invention provide a light-colored material composition with random particle shapes so as to reflect and diffuse the radiant energy sufficiently to prevent melting of an overlying plastic insulator sheet.

More specifically, the presently improved radiation switch comprises an admixture of material having a dried composition by weight of 34-74% silver carbonate and/or silver oxide, 25-65% of electrically nonconductive inert particulate solids and 0.5-5% binder. Further, if the nonconductive particulate solids include a sodium-containing material, the proportion of the sodium-containing material is not to be more than 10% by weight of the total dried composition. Such a switch composition provides sufficient desensitization of the solid state switch to prevent the aforementioned "burn off" and "melt-through" problems even when the associated flashlamps are comparatively hot after flashing and disposed in very close proximity to the switch location. The resulting lighter color of the dried switch paste, and its greater reflectivity, results in the absorption of much less of the radiant energy, so as to preclude "melt-through" of an overlying plastic insulator sheet.

BRIEF DESCRIPTION OF THE DRAWINGS

This invention will be more fully described hereinafter in conjunction with the accompanying drawings in which.

DESCRIPTION OF PREFERRED EMBODIMENT

Figure 1:
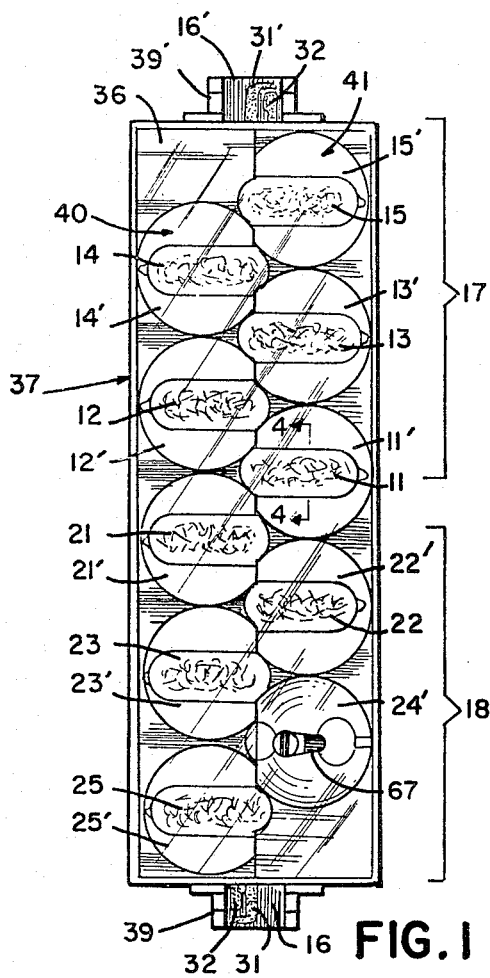
FIG. 1 is a front elevation of a multilamp photoflash unit in which the present invention is employed.

FIG. 1 illustrates a multilamp photoflash unit of the type described in the aforementioned copending application Ser. No. 840,497 Audesse et al. This unit is similar in general operation to that described in the aforementioned U.S. Pat. No. 4,017,728, except that the construction has been modified to include additional lamps in a housing having the same outer dimensions. Whereas the unit described in the above-mentioned patent included a planar array of eight high voltage type flashlamps (two groups of four) with associated reflector cavities provided in a single reflector member, the present unit comprises a planar array of ten flashlamps 11-15 and 21-25 mounted on a printed circuit board 43 (see FIG. 2) with an array of respectively associated reflector cavities 11'-15' and 21'-25' disposed therebetween. Lamp 24 is omitted in FIG. 1 to show reflector cavity 24', which is typical of all the reflector caivites. The lamps are horizontally disposed and mounted in two parallel columns, with the lamps of one column staggered relative to the lamps of the other column. Each of the lamps has a pair of lead-in wires (not shown) connected to the printed circuitry on board 43 by respective eyelets 11a and 11b, etc. The column of the lamps 15, 13, 11, 22 and 24 are positioned with their respective bases interdigitated with the bases of the adjacent column comprising lamps 14, 12, 21, 23 and 25, the bases of one column thereby facing the adjacent column. The reflector cavities are provided on a pair of strip-like panels 40 and 41 which are conveniently separable for assembly purposes. The array is provided with a plug-in connector tab 16 at the lower end thereof which is adapted to fit into a camera or flash adaptor. A second plug-in connector tab 16' is provided at the top end of the unit, whereby the array is adapted to be attached to the camera socket in either of two orientations, i.e. with either the tab 16 or the tab 16' plugged into the socket. The lamps are arranged in two groups of five disposed on the upper and lower halves, respectively, of the elongated, rectangular-shaped array. Upper group 17 comprises lamps 11-15, and lower group 18 includes lamps 21-25; the reflector cavities 11', etc. are disposed behind the respective lamps so that as each lamp is flashed, light is projected forwardly of the array. The lamps are arranged and connected so that when the array is connected to a camera by the connector tab 16 only the upper group 17 of lamps will be flashed. By this arrangement, only lamps relatively far from the camera lens axis are flashable, thus reducing the undesirable "red-eye" effect.

The construction of the array comprises front and back housing members 36 and 37 (only the outer periphery of the back housing member is visible in FIG. 1), which preferably are made of plastic and are provided with interlocking members (not shown) which can be molded integrally with the housing members and which lock the housing members together in final assembly to form a unitary flash array structure. In the preferred embodiment, the front housing member 36 is a rectangular concavity and the back housing member 37 is substantially flat and includes integral extensions 39 and 39' at the ends thereof which partly surround and protect the connector tabs 16 and 16' and also function to facilitate mechanical attachment to the camera socket. Sandwiched between the front and back housing members 36 and 37, in the order named, are the flashlamps 11, etc., and the pair of adjacent strip-like reflector panels 40 and 41 (preferably each being an aluminum-coated plastic molding) shaped to provide the individual reflector cavities 11' etc., a transparent electrically insulating sheet 42 (shown only in FIG. 4), the printed circuit board 43 provided with integral connector tabs 16 and 16', and an indicia sheet (not shown) which may be provided with information and trademarks, and other indicia such as flash indicators located behind the respective lamps and which change color due to heat and/or light radiation from a flashing lamp, thus indicating at a glance which of the lamps have been flashed and not flashed.

Window means, such as openings 67, are provided in each of the reflector cavities 11', etc., behind the lamp aligned therewith. The circuit board 43 is provided with corresponding openings 30 to facilitate radiation from the flashlamps reaching the flash indicators. The rear housing member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly of the array and may be tinted to alter the color of the light from the flashlamps.

The height and width of the rectangular array are substantially greater than its thickness, and the height and width of the reflector panels 40, 41, the insulating sheet 42, and circuit board 43 are substantially the same as the interior height and width of the housing member 36 to facilitate holding the parts in place.

Figure 2:
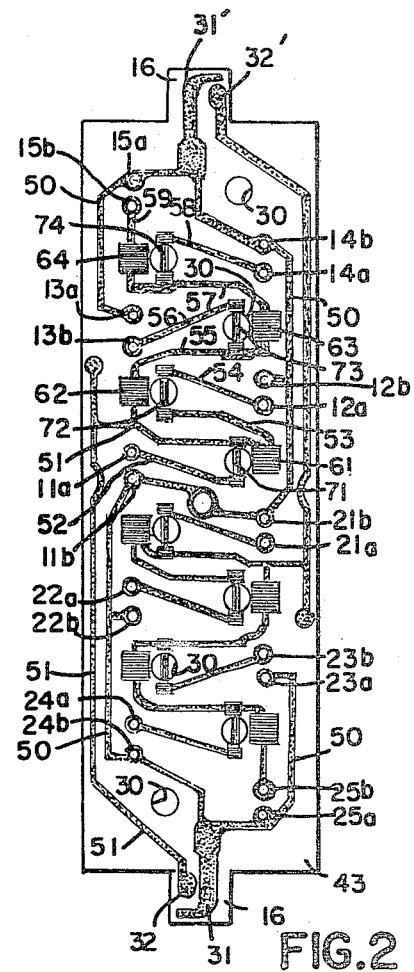
FIG. 2 is a front elevation of a circuit board used in the unit of FIG. 1, the circuit board including radiation connect switches in accordance with the invention.

Referring to both FIGS. 1 and 2, the tab 16, which is integral with the circuit board 43, is provided with a pair of electrical terminals 31 and 32, and similarly the tab 16' is provided with a pair of terminals 31' and 32', for contacting terminals of a camera socket for applying firing voltage pulses to the array. The terminals 31 and 31' are shown as having a J-shaped configuration for temporarily shorting the socket terminals, while the array is being plugged in, to discharge any residual voltage charge in the firing pulse source and also to reduce the likelihood of lamps being accidentally flashed by electrostatic voltage when the array is handled.

Referring to FIG. 2, the circuit board 43 has a "printed circuit" thereon for causing sequential flashing of the lamps by firing voltage pulses applied to the terminals 31, 32, 31', 32'. In accordance with the present invention, the printed circuit is uniquely modified from that described in the aforementioned U.S. Pat. Nos. 3,894,226 or 4,017,728 in order to extend the circuitry in a reliable operating manner to accommodate an additional lamp in each half of the printed circuit board. The top and bottom halves of the printed circuitry preferably are reverse mirror images of each other. The lead wires (not shown) of the lamps 11 etc., (FIG. 1) may be attached to the circuit board 43 in various ways such as by means of the metal eyelets 11a, 11b, etc., placed through openings in the board. The lead wires underlie the reflector panels and pass into or through the respective pairs of eyelets 11a, 11b, etc. The ends of the eyelets are crimped or bent to hold the lead wires and make electrical contact thereto and also to hold the eyelets in place with their heads in electrical contact with the circuit of the circuit board.

The circuit located on the upper half of the circuit board of FIG. 2 and activated by the pair of input terminals 31 and 32 includes five lamps 11–15 arranged in parallel across the input terminals and four normally closed (N/C) radiant-energy-activated disconnect switches 71, 72, 73, and 74 each connected in series with a respective one of the lamps 11–14. Each N/C disconnect switch is responsive to the flashing of the lamp with which it is series-connected to form an open circuit. The circuit also includes four normally open (N/O) radiant-energy-activated connect switches 61, 62, 63, and 64 for providing sequential flashing of the lamps 11–15 in response to firing pulses successively applied to the input terminals 31 and 32. Each N/O connect switch is responsive to the flashing of an associated lamp to form a closed circuit condition. One terminal (lead-in-wire) of each of the lamps 11–15 is connected in common by means of an electrical "ground" circuit run 50 to input terminal 31. The "ground" circuit run 50 includes the terminals 31 and 31' and makes contact with one of the connector eyelets for each of the lamps.

The first lamp to be fired, namely, lamp 11, is connected directly across the input terminals 31 and 32 via the N/C disconnect switch 71. The second through fourth N/O connect switches, namely, 62, 63 and 64, are series connected in that order with lamp 15, which is the fifth and last lamp to be fired, across the input terminals 31 and 32. Further, the third lamp to be fired (lamp 13) is series connected with N/O switch 62, and the fourth lamp to be fired (lamp 14) is connected in series with N/O switch 63.

In order to limit the resistance build-up caused by additional series N/O switches, and any possible circuit discontinuity caused by misplacement of the first N/C switch 71, the first N/O switch to be activated (Switch 61) is series-connected with the second lamp to be fired (lamp 12) across the input terminals 31 and 32 but parallel-connected with the above-mentioned series combination of N/o switches 62–64 and lamp 15.

Terminal 32 is part of a conductor run 51 that terminates at three different switches, namely, the N/C disconnect switch 71, the N/O connect switch 61, and the N/O connect switch 62. The other side of switch 71 is connected to lamp 11 via circuit run 52 and eyelet 11a. Circuit run 53 connects switches 61 and 72, and circuit run 54 connects the other side of switch 72 to lamp 12 via eyelet 12a. A circuit run 55 interconnects switches 62, 73 and 63, while the other side of switch 73 is connected to lamp 13 via circuit run 56, and eyelet 13b. Switches 63, 74 and 64 are interconnected by a circuit run 57, while the other side of switch 74 is connected to lamp 14 via circuit run 58 and eyelet 14a. Finally, a circuit run 59 connects the other side of switch 64 to lamp 15 via eyelet 15b.

Figure 3:
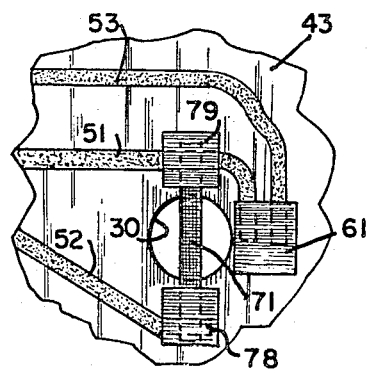
FIG. 3 is an enlarged fragmentary detailed view of a portion of the circuit board of FIG. 2 showing the switching arrangement associated with one of the lamps.
Figure 4:
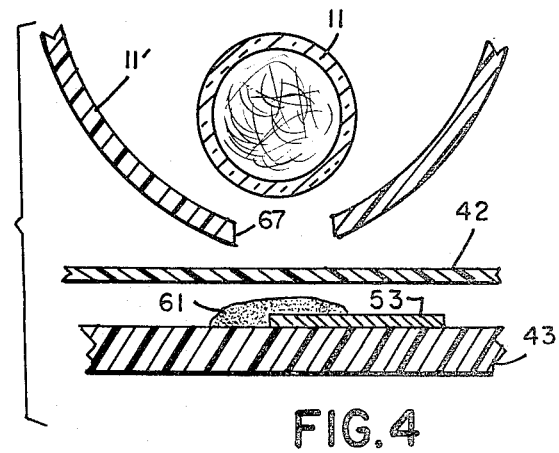
FIG. 4 is an enlarged fragmentary schematic cross-sectional view taken along 4—4 of FIG. 1.

The radiant-energy-activated N/O connect switches 61–64 are in contact with and bridge across the circuit runs that are connected to them. More specifically, each N/O switch comprises a mass of material interconnected to a pair of spaced apart electrical terminals in the circuits. FIGS. 3 and 4 illustrate this for switch 61. The material for the connect switch is selected to be of the type initially having an open circuit or high resistance, the resistance thereof becoming nearly zero or a lower value when the material receives radiation in the form of heat and/or light from a respective adjacent lamp, upon the lamp being flashed. For this purpose, each of the connect switches is respectively positioned behind and near to an associated flashlamp 11–14. To facilitate radiation transfer from the flashlamp to its corresponding N/O connect switch, each of the reflectors includes a window means, such as an opening 67, in alignment with the respective radiation connect switches. Each of these connect switches has a composition according to the invention, as will be described hereinafter, and upon receiving heat and/or light radiation from the adjacent lamp when it is flashed, changes from an open circuit or high resistance to a closed circuit or lower resistance between its switch terminals on the circuit board.

As described in the previously referenced U.S. Pat. No. 4,017,728 Audesse et al, each of the N/C disconnect switches 71–74 comprises a length of electrically conductive, heat shrinkable, polymeric material which is attached to the circuit board at both ends, with its mid-portions spatially suspended to avoid contact with the heat absorbing surfaces of the circuit board. This arrangement maximizes the speed with which the shrinking and separation of the midportion of the switch element occurs upon its being heated by the radiant output of an ignited flashlamp. More specifically, referring to the embodiment illustrated in FIG. 3, the disconnect switch comprises a thin strip 71 of plastic, preferably fabricated from mono- or biaxially oriented polyethylene, polypropylene, polystyrene, polyester or nylon. The polymeric material itself may be rendered electrically conductive by esters such as carbons, or it may be rendered surface conductive by deposition of conductive layers thereon. Such conductive surface layers may be obtained, e.g., by a vacuum metallization, electrolysis plating, printing, or coating using conductive inks, or by silk screening or by otherwise applying a conductive path across the switch defined by the polymeric film. The performance of highly reflective materials, such as aluminized polypropylene, can be enhanced by applying a coating of light-absorbing ink or other similar material onto the surface facing the flashlamp. The piece of switch material may be self-adhesive, such as tape, and pressure applied to attach both ends of the strip 71 to the circuit board as illustrated. Each attached strip is located so that is bridges a respective one of the circuit board apertures 30 so as to provide the desired spatial suspension of the midportion of the strip. For silk screened circuitry, it is advantageous to carry the circuit pattern over the ends of the preapplied switch strip. In this manner, the circuit material helps to anchor the switch ends to the circuit board substrate, in addition to providing electrical connection of both ends of the switch strip into the printed circuit.

By locating the disconnect switch strips across the apertures 30, each element of heat shrinkable material is position so as to be in operative relationship with the radiant output of its respective lamp via an aperture (not shown) in the back of the reflector. Hence, upon ignition of a given flashlamp, the switch material is radiantly heated so that it weakens and softens as well as shrinks. As separation occurs near the center of each piece, the two separate ends shrink back away from each other so as to give an open circuit that will reliably withstand several thousand volts without leakage. Since a lamp after flashing is removed electrically from the circuit, the subsequent lamps are unaffected by short circuiting or residual conductivity in previously flashed lamps.

As described in U.S. Pat. No. 4,130,857, Brower, the high resistance material employed in providing the N/O connect switches 61–64 is also disposed on and about each of the ends of the N/C disconnect switches. For example, as illustrated in FIG. 3, the disconnect strip switch 71 is attached to circuit board 43 so as to extend laterally across aperture 30 with respect to the lamp. Conductive trace 53 extends to provide one electrical terminal for a connect switch 61 while a trace 51 provides the other connect switch terminal. In addition, trace 51 is carried over one end of strip 71, and trace 52 contacts the other end of strip 71. In this instance, patches 78 and 79 of high resistance material cover each end of the conductive strip 71 to shield the circuit run carry-over regions from abrasion during the manufacturing process and further secure the strip to the circuit board. In addition to this mechanical protection, the high resistance patches 78 and 79 provide insulation to prevent shorting or spark-over between the strip ends and the nearby circuit traces 53 and 50 (also see FIG. 2). In this position, the patches 78 and 79 are masked by the reflector during flashing. Although there are other methods of insulating the disconnect switch ends, such as by a coat of insulating resin, use of the connect switch paste eliminates a production process, as will be made clear hereinafter, by combining the switch-depositing step and an insulating step.

As has been explained, the lower portion of the circuit board contains a substantially reverse mirror image of the same circuitry shown in the upper part of the circuit board, and therefore will not be described in detail. It will be noted that the circuit runs from the plugged in terminals 31 and 32 at the lower part of the circuit board extend upwardly so as to activate the circuitry in the upper half of the circuit board. Similarly when the unit is turned around and tab 16' is plugged into a socket, the circuit board terminals 31' and 32' will be connected to activate the lamps which then will be in the upper half of the circuit board, and hence in the upper half of the flash unit. This accomplishes the desirable characteristic whereby only the group of lamps relatively farthest away from the lens axis will be flashed thereby reducing the possibility of the phenomena known as "red-eye".

The circuit on the circuit board 43 functions as follows. Assuming that none of the five lamps in the upper half of the unit have been flashed, upon occurrence of the first firing pulse applied across the terminals 31 and 32, this pulse will be directly applied to the lead-in wires of the first-connected flashlamp 11, whereupon the lamp 11 flashes and becomes an open circuit between its lead-in wires. Heat and/or light radiation from the flashing first lamp 11 is operative via its respective reflector aperture to activate the N/C disconnect switch 71 and the N/O connect switch 61. As a result, the normally closed disconnect switch 71 is operative in response to the radiation from the lamp to rapidly provide a reliable open circuit to high voltages and thus electrically remove lamp 11 from the circuit, whereby the subsequent lamps 12-15 are unaffected by short circuiting or residual conductivity in lamp 11. The radiation causes the normally open connect switch 61 to become a closed circuit (or a low value of resistance), thereby connecting the circuit board terminal 32 electrically to the second lamp 12 via the normally closed disconnect switch 72. By the time this occurs, the firing pulse has diminished to a value insufficient to cause the second lamp 12 to flash. When the next firing pulse occurs, it is applied to the lead-in wires of the second lamp 12 via the now closed connect switch 61 and disconnect switch 72, whereupon the second lamp 12 flashes, thereby causing disconnect switch 72 to rapidly provide an open circuit and causing connect switch 62 to assume near zero or low resistance. Once switch 62 has been activated, the resistance of the N/O connect switch 61 is bypassed along with any potential discontinuity caused by the N/C disconnect switch 71. When the next firing pulse occurs, it is applied via now closed connect switch 62 and disconnect switch 73 to the third lamp 13, thereby firing that lamp, whereupon the radiation from lamp 13 activates disconnect switch 73 to rapidly provide an open circuit and causes connect switch 63 to become essentially a closed circuit across its terminals. The next firing pulse will be applied, via now closed connect switch 63 and disconnect switch 74 to the lead-in wires of the fourth flashlamp 14, thereupon causing the lamp to flash. The radiation from lamp 14 activates the disconnect switch 74 to rapidly provide an open circuit and causes connect switches 64 to become essentially a closed circuit across its terminals. Thus, the next firing pulse will be applied, via now closed connect switch 64 to the lead-in wires of the fifth flashlamp 15, thereupon causing the lamp to flash. Since this lamp is the last lamp in the active circuit, it does not matter whether its lead-in wires are an open or closed circuit after flashing. When the flash unit is turned around and the other connector tab 16' attached to the camera socket, the group 18 of lamps that then becomes uppermost and farthest away from the lens axis will be in the active circuit and will be flashed in the same manner as has been described. In a preferred embodiment, the lamps 11, etc., are high voltage types requiring about 2000 volts, for example, at low current for flashing, and they can be fired by impacting or stressing a piezoelectric element in the camera.

In accordance with the present invention, each of the solid state, radiation connect switches 61-64 is a dried mass material having a composition by weight of 34-74% silver carbonate and/or silver oxide, 25-65% of electrically nonconductive inert particulate solids, such as titanium dioxide, and 0.5-5% binder, such as polystyrene resin. According to a preferred embodiment, the dried composition of a silk-screenable switch incorporating the inventive principals disclosed herein is 67.43% silver carbonate, 22.48% titanium dioxide, 8.99% glass beads, 0.11% barium chromate, 0.07% lecithin as a wetting agent, and 0.91% polystyrene resin as a binder. The barium chromate was included to enhance environmental stability as described in U.S. Pat. No. 4,087,233. The mixture is made into a paste by ball milling in a suitable solvent such as butyl cellosolve acetate. The solids content may be adjusted to suit the method of switch application. For silk screening over a circuit board, we prefer to adjust the solids content to about 74%. This mixture is deposited as a mass of material across respective conductor run terminations, as represented by patches 61-64. For example, FIGS. 3 and 4 illustrate switch 61 wherein such a mixture is deposited as a mass bridging conductor runs 53 and 51. The comparatively large amounts of inert filler employed to replace the silver carbonate in the switch composition according to present invention has enabled the very compact photoflash unit packaging of FIGS. 1 and 2 to be provided while maintaining or improving the high functional reliability of the normally open connect switches 61-64. The sodium leaching of the glass beads restricts the proportion of this inert particulate to not more than 10% by weight of the total dried composition. Alternative filler material that may be used alone or in combination with the titanium dioxide include aluminum oxide, aluminum phosphate, barium sulfate, and silicon dioxide.

Although the preferred embodiment of the connector switch composition described above was based on silver carbonate, it logically follows that similar results would be afforded to silver oxide type switches. The reason for this is that silver oxide is an intermediate stage in the decomposition of silver carbonate, it being formed after evolution of carbon dioxide. Similarly, switches using binder materials other than polystyrine resin can equally be benefited by the inventive principals taught herein. For example, other useful binders include cellulose esters, cellulose ethers, polyalkylacrylates, polyalkylemethacrylates, styrene copolymers, vinyl polymers, and polycarbonate.

Accordingly, although the invention has been described with respect to specific embodiments, it will be appreciated that modifications and changes may be made by those skilled in the art without departing from the true spirit and scope of the invention.

What we claim is:

1. A radiation switch for a photoflash unit comprising an admixture of material having a dried composition by weight of 34-74% silver carbonate and/or silver oxide, 25-65% of electrically non-conductive inert particulate solids, and 0.5-5% binder, said nonconductive particulate solids including a sodium-containing material, the proportion of said sodium-containing material being not more than 10% by weight of said total dried composition.

2. The switch composition of claim 1 wherein said sodium-containing material comprises glass beads.

3. The switch composition of claim 2 wherein said nonconductive particulate solids include said glass beads and one or more members selected from the group consisting of titanium dioxide, aluminum oxide, aluminum phosphate, barium sulfate, and silicon dioxide.

4. The switch composition of claim 3 wherein said nonconductive particulate solids consist of titanium dioxide and glass beads.

5. The switch composition of claim 1 wherein said nonconductive particulate solids are one or more members selected from the group consisting of titanium dioxide, aluminum oxide, aluminum phosphate, barium sulfate, and silicon dioxide.

6. In a multilamp photoflash unit comprising a pair of flashlamps, an electrical circuit into which said lamps are arranged to fire individually and in sequence, and a solid state radiation switch located external of the lamps and forming part of said electrical circuit, said switch being located adjacent one of said flashlamps to receive radiant energy emitted by that flashlamp, the improvement wherein said radiation switch comprises an admixture of material having a dried composition by weight of 34–74% of silver carbonate and/or silver oxide, 25–65% of electrically nonconductive inert particulate solids, and 0.5–5% binder, said nonconductive particulate solids including a sodium-containing material, the proportion of said sodium-containing material being not more than 10% by weight of said total dried composition.

7. The photoflash unit of claim 6 wherein said radiation switch comprises a mass of said material interconnected to a pair of spaced-apart electrical terminals in the electrical circuit.

8. The photoflash unit of claim 7 wherein said nonconductive particulate solids are one or more members selected from the group consisting of titanium dioxide, aluminum oxide, aluminum phosphate, barium sulfate, and silicon dioxide.

9. The photoflash unit of claim 7 wherein said nonconductive particulate solids include glass beads and one or more members selected from the group consisting of titanium dioxide, aluminum oxide, aluminum phosphate, barium sulfate, and silicon dioxide, the proportion of said glass beads being not more than 10% by weight of said total dried composition.

* * * * *